US007954219B2

(12) United States Patent
Seddon et al.

(10) Patent No.: US 7,954,219 B2
(45) Date of Patent: Jun. 7, 2011

(54) SUBSTRATE HOLDER ASSEMBLY DEVICE

(75) Inventors: Richard I. Seddon, Sunnyvale, CA (US); Russell Edward Barbaria, Geyserville, CA (US); Ralf Erz, Santa Rosa, CA (US); Markus K. Tilsch, Santa Rosa, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 908 days.

(21) Appl. No.: 11/851,779

(22) Filed: Sep. 7, 2007

(65) Prior Publication Data
US 2008/0006529 A1     Jan. 10, 2008

Related U.S. Application Data

(63) Continuation-in-part of application No. 11/205,513, filed on Aug. 17, 2005, now Pat. No. 7,790,004, and a continuation-in-part of application No. 10/968,642, filed on Oct. 19, 2004, now Pat. No. 7,785,456, application No. 11/851,779, filed on Sep. 7, 2007.

(60) Provisional application No. 60/603,211, filed on Aug. 20, 2004, provisional application No. 60/826,230, filed on Sep. 20, 2006.

(51) Int. Cl.
   *B25B 27/04*     (2006.01)
(52) U.S. Cl. ............... 29/281; 29/559; 29/464; 269/71
(58) Field of Classification Search ............ 269/71–73, 269/47, 56, 79, 309–310, 903; 29/559, 464, 29/281; 414/758
   See application file for complete search history.

(56) References Cited

U.S. PATENT DOCUMENTS

| | | | |
|---|---|---|---|
| 3,616,452 A | 10/1971 | Bessot et al. | 204/298.06 |
| 3,858,547 A | 1/1975 | Bergfelt | 118/730 |
| 4,034,704 A | 7/1977 | Wossner et al. | 118/730 |
| 4,250,009 A | 2/1981 | Cuomo et al. | 204/192.11 |
| 4,485,759 A | 12/1984 | Brandolf | 118/503 |
| 4,568,070 A * | 2/1986 | Severt | 269/60 |
| 4,960,485 A | 10/1990 | Ichinose et al. | 156/556 |
| 5,106,346 A | 4/1992 | Locher et al. | 475/11 |
| 5,232,569 A | 8/1993 | Nelson et al. | 204/192.15 |
| 5,598,775 A * | 2/1997 | Vongfuangfoo et al. | 100/233 |
| 5,795,448 A | 8/1998 | Hurwitt et al. | 204/192.1 |
| 5,802,698 A * | 9/1998 | Fitzgerald et al. | 29/559 |
| 6,464,825 B1 | 10/2002 | Shinozaki | 156/345.55 |
| 6,844,274 B2 * | 1/2005 | Yoshioka et al. | 438/800 |
| 7,790,004 B2 * | 9/2010 | Seddon | 204/298.15 |
| 2005/0014368 A1 | 1/2005 | Yoshioka et al. | 438/689 |
| 2005/0189228 A1 | 9/2005 | Huang | 205/157 |

FOREIGN PATENT DOCUMENTS

| | | |
|---|---|---|
| JP | 61010239 | 1/1986 |
| RU | 2008501 | 2/1994 |
| WO | 02/19379 | 3/2002 |

OTHER PUBLICATIONS

European Search Report, European Published Patent Application No. 1903603, Aug. 6, 2009.

* cited by examiner

*Primary Examiner* — George Nguyen
(74) *Attorney, Agent, or Firm* — Matthew A. Pequignot; Pequignot + Myers LLC

(57) ABSTRACT

A device for mounting and removing a substrate from a baseplate, in particular a substrate holder assembly device, including automated features for latching and unlatching a substrate, for use in a coating mechanism, from a baseplate, which includes an adjustable snap ring holder.

16 Claims, 9 Drawing Sheets

SUBSTRATE HOLDER ASSEMBLY DEVICE

CROSS-REFERENCE TO RELATED APPLICATIONS

The present invention is a continuation in part of U.S. patent application Ser. No. 11/205,513 filed Aug. 17, 2005 now U.S. Pat. No. 7,790,004, which claims priority from U.S. Patent Application No. 60/603,211 filed Aug. 20, 2004 and which is a continuation in part of U.S. patent application Ser. No. 10/968,642 filed Oct. 19, 2004 now U.S. Pat. No. 7,785,456, all of which are incorporated herein by reference. The present invention also claims priority from U.S. Patent No. 60/826,230 filed Sep. 20, 2006, which is incorporated herein by reference.

TECHNICAL FIELD

The present invention relates to a device for mounting and removing a substrate from a baseplate, and in particular to a substrate holder assembly device including automated features for latching and unlatching a substrate, for use in a coating mechanism, from a baseplate, which includes an adjustable snap ring holder.

BACKGROUND OF THE INVENTION

Conventional substrate holders 1, illustrated in FIG. 1, include a baseplate 2 fastened to an annular cover 3 using screw fasteners 4. The annular cover 3 includes an annular shoulder 6 for holding the edges of one or more substrates 7 against the baseplate 2. A cylindrical recess 8, or other alignment feature, is provided in the baseplate 2 for receiving a tapered pin from a mounting mechanism in a coating system, thereby providing a mating alignment feature therefor.

Unfortunately, substrate holders, which utilize screw fasteners, waste valuable time during the assembly and disassembly processes, while a technician manually assembles and disassembles the annular cover from the base. Furthermore, manual manipulation of the substrate holder increases the risk of damage to the substrate holders or worse, the substrates themselves.

An object of the present invention is to overcome the shortcomings of the prior art by providing an automated substrate holder assembly device, which eliminates the need for screw fasteners, and minimizes the substrate holder to human contact.

SUMMARY OF THE INVENTION

Accordingly, the present invention relates to a substrate holder assembly device for assembling and disassembling a substrate holder of the type including a base with a detent, and a cover with a catch for engaging the detent and securing the cover to the base, comprising:

a substrate holder mount for supporting the substrate holder face down;

a substrate holder loading dock for supporting the substrate holder face up during assembly and disassembly;

a lifting arm moveable between the substrate holder mount and the substrate holder loading dock for picking the substrate holder up, flipping the substrate holder over, and placing the substrate holder on the substrate holder loading dock; and actuator means extending from the substrate holder loading dock for disengaging the detent from the catch, thereby enabling the cover to be separated from the base, and a substrate to be loaded or unloaded from the substrate holder.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
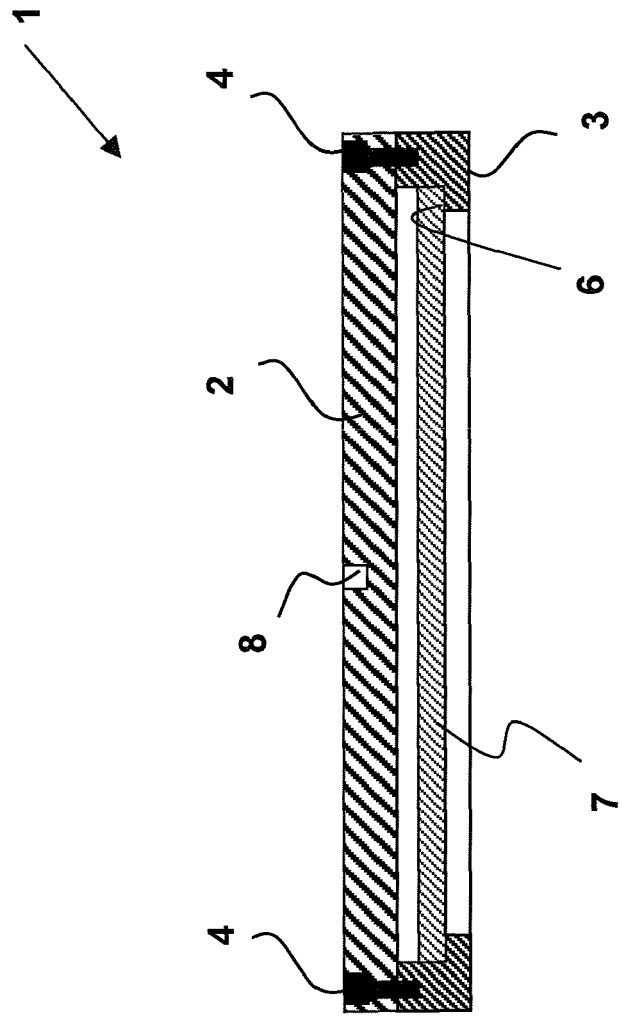
FIG. 1 illustrates a conventional substrate holder.
Figure 2:
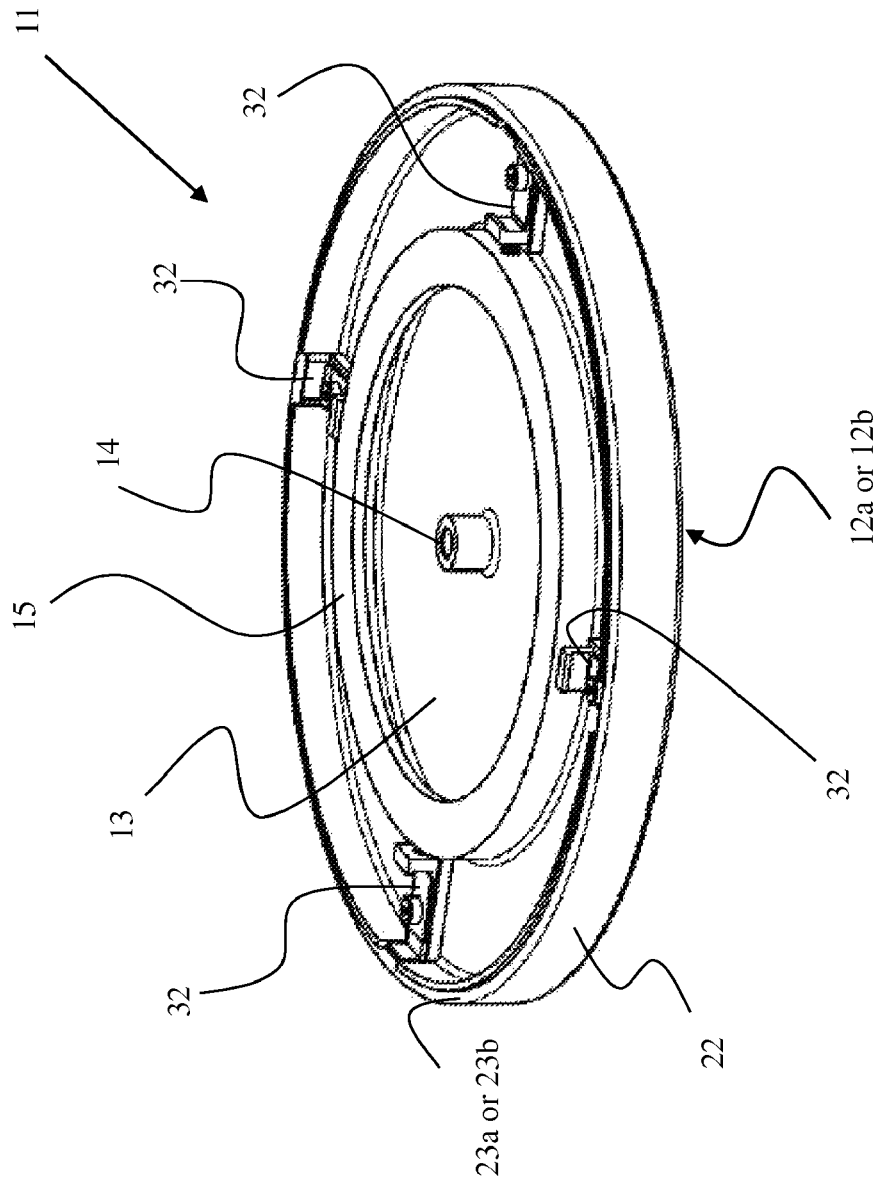
FIG. 2 is an isometric view of a substrate holder in accordance with the present invention.
Figure 3:
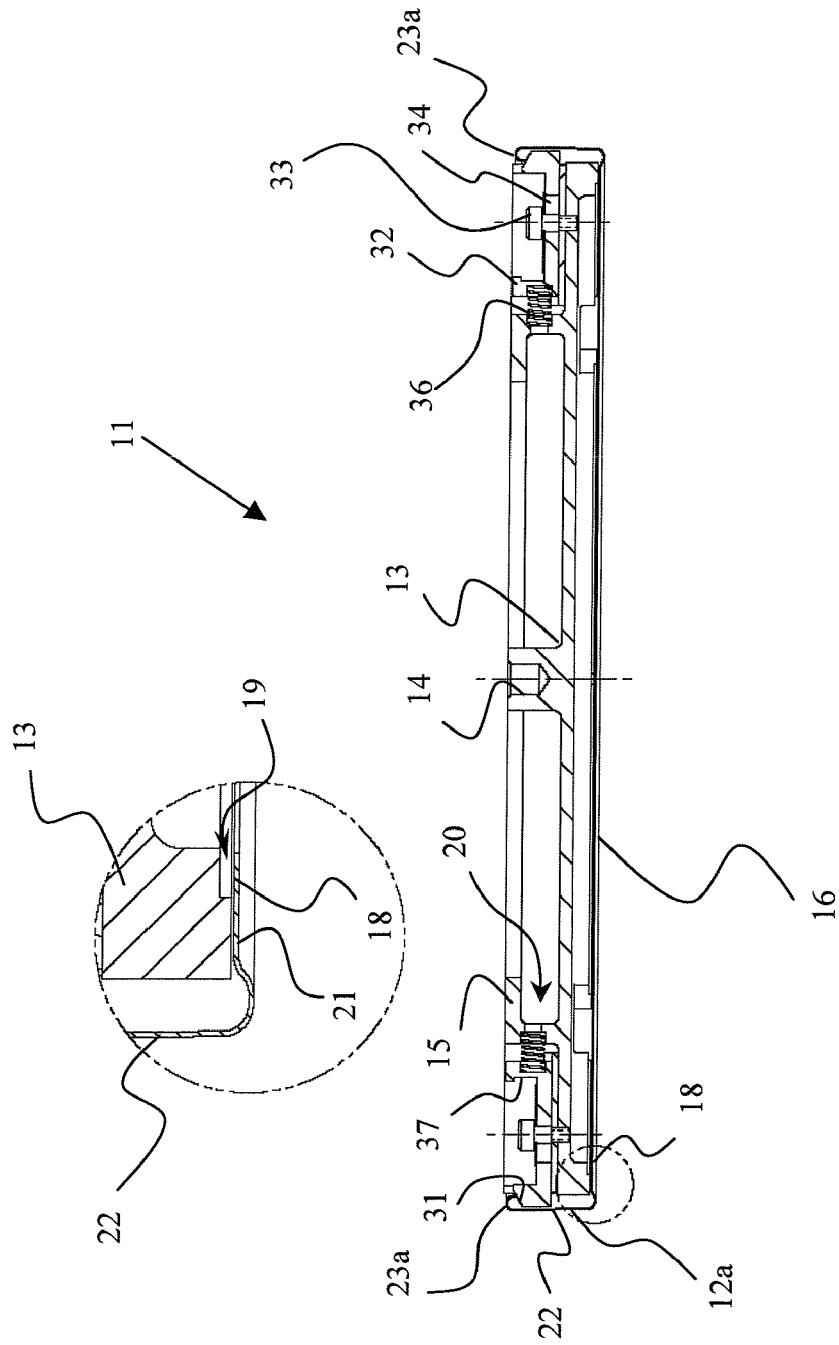
FIG. 3 is a cross-sectional view of an embodiment of the substrate holder of FIG. 2.
Figure 4:
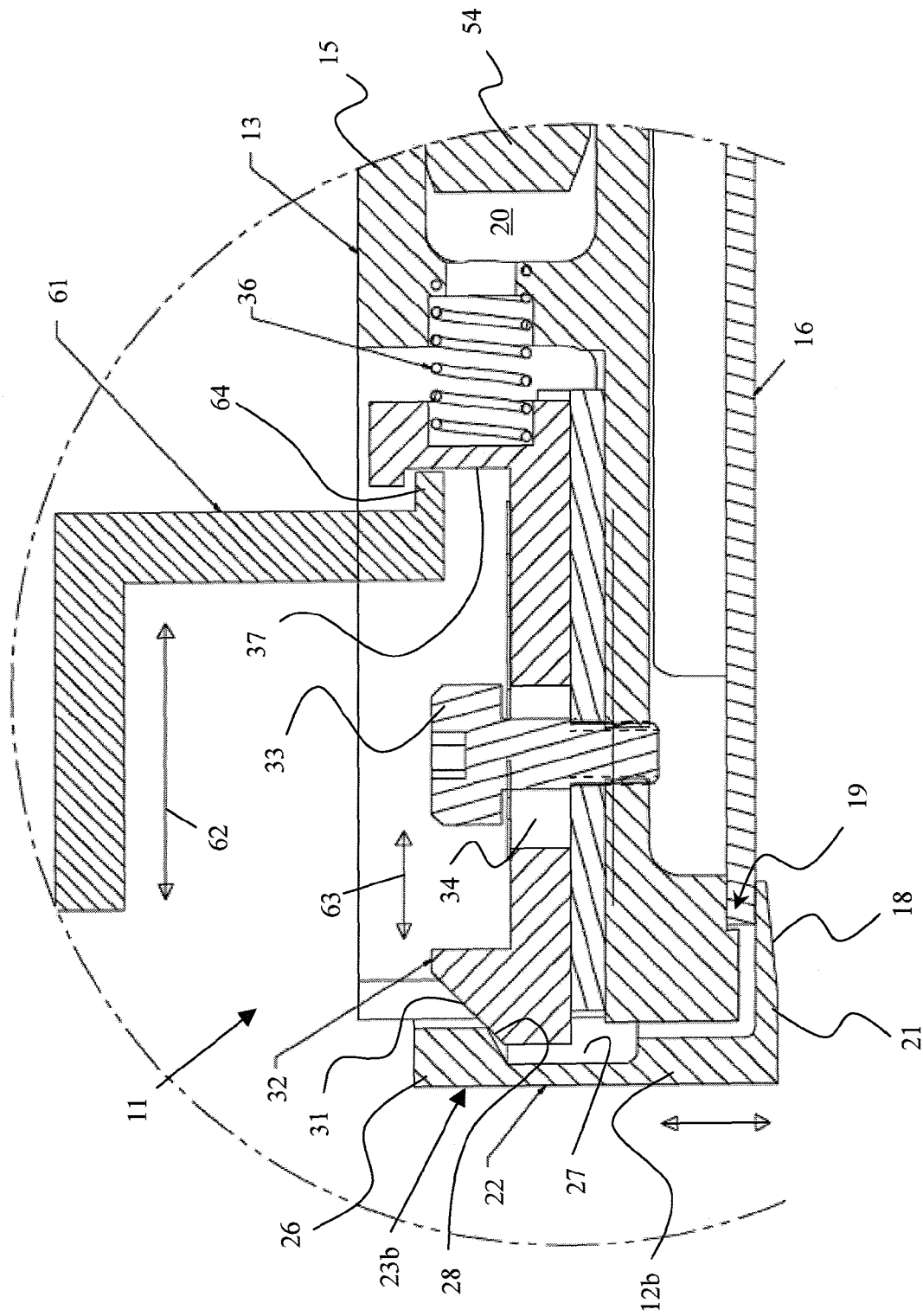
FIG. 4 is a cross-sectional view of another embodiment of the substrate holder of FIG. 2.

With reference to FIGS. 2 to 4, a preferred substrate holder 11 in accordance with the present invention includes a generally disposable cover 12a (FIG. 3) or a generally reusable cover 12b (FIG. 4) mounted on a base 13, which is preferably formed entirely or at least partially of a material that is attracted by a magnetic latch, e.g. a ferromagnetic material including one or more of iron, cobalt and nickel, as disclosed in U.S. patent publication No. 2006/0081468 published Apr. 20, 2006 to the Applicant's of the present invention. The base 13 includes a cylindrical protrusion 14 with a recess for receiving a tapered pin from the magnetic latch, and an annular mounting ring 15 forming an annular groove 20, which will be described hereinafter. The base 13 provides a protective cover for the back side of a substrate 16, thereby preventing unintentional and unwanted back coating. Each cover 12a and 12b includes one or more openings for substrates 16, and defines a lip 18 extending around each opening. Each lip 18 holds an edge of a substrate 16 in a slot 19 formed in an upper face of the base 13. The openings in the covers 12a and 12b are typically round, but could be any shape, e.g. square or oval, depending upon the shape of the substrate(s) 16.

The covers 12a and 12b also include an annular intermediate region 21 to ensure the upper face of the base 13 is covered, thereby protected from stray coating material. An annular flange 22 extends perpendicularly from the intermediate region 21 adjacent to a sidewall of the base 13 to protect the sidewall of the base 13 from stray coating material. For cover 12a (FIG. 3), an upper and outer free edge 23a of the annular flange 22 is bent inwardly back around parallel with the rest of the annular flange 22 forming a catch or camming surface for engaging a latching surface 31 on the base 13. Alternatively, one or more separate clips could extend from the cover 12a, perpendicular thereto, into engagement with a latching surface 31 of a detent 32. Preferably, the clips would be made of a resilient material, e.g. the same sheet metal as the cover 12a, enabling the clips and the cover 12a to be manually released with relative ease, i.e. without the aid of tools. Various mechanical means can be provided to facilitate disengagement of the clips including levers, push buttons and rotating knobs extending therefrom.

The upper or outer free edge of the annular flange 22 of the cover 12b, see FIG. 4, includes a solid annular ring 26 and an annular groove 27. The annular ring 26 provides a catch for the detent 32, and has a beveled corner 28 adjacent to the annular groove 27 providing a camming surface for engaging the latching surface 31.

To facilitate removal of the cover 12a or 12b from the base 13, the latching surface 31 is disposed on the moveable detent or slide 32, which reciprocates towards the center, e.g. radially, of the base 13, i.e. towards cylindrical recess 14, when a sufficient force is applied thereto. A threaded fastener 33 extends through a slot 34 in the detent 32 into the base 13 for guiding the detent 32 during reciprocation. A spring 36 extending from the back of the annular ring 15 spring biases the detent 32 outwardly, so that the latching surface 31 engages the camming surface on the catch, i.e. the outer free edges 23a or 23b of the annular flange 22, and providing a set force, which must be overcome to release the cover 12a or 12b from the base 13. The latching surface 31 also includes a beveled edge, at approximately the same angle as the beveled corner 28, enabling the beveled edge of the latching surface 31 to engage the beveled corner 28 at various positions, which correspond to different substrate thicknesses. The annular groove 27 provides a sufficient gap for receiving the end of the detents 32 at various positions corresponding to different substrate thicknesses. An abutment surface 37 is provided on an end of the detent 32 opposite the latching surface 31, and adjacent to where the spring 36 engages the detent 32, for reasons hereinafter discussed.

A typical substrate would be a glass wafer 200 mm in diameter and 0.2 mm to 1.4 mm thick; however, other substrate forms are possible, e.g. up to 32 mm in thickness and a mass of up to 2 kg.

The substrate holders, illustrated in FIGS. 2 to 4, utilize either disposable covers 12a, which are preferably fabricated from an inexpensive sheet metal stamping, which can be disposed of after one or two uses or reusable covers 12b. The covers 12a and 12b hold the substrate 16 securely and precisely relative to the base 13 during acceleration, vibration and temperature cycling. Moreover, the covers 12a and 12b shield the base 13 from stray coating flux, which would otherwise become deposited on the base 13 causing damage to the substrates 16, if flaked off.

Ideally, the covers 12a and 12b include surface characteristics on the outside, which encourage adhesion of stray coating material, and surface characteristics on the inside that facilitate easy cleaning and will not downgrade the substrate 16 when coming into contact there-with. The material or materials for covers 12a and 12b should have a low vapor pressure at coating temperatures, thereby minimizing any material released therefrom from contaminating the substrates 16 or otherwise influencing the coating process.

Disposable covers 12a should be inexpensive, easily formable with enough resiliency to provide spring forces when appropriate, have a low vapor pressure at coating temperatures, and have minimal toxic waste issues. Ideally, the disposable covers 12a are between 0.005 in. and 0.015 in. thick; however, thinner covers are possible for very small substrates, i.e. up to 0.015 in is preferred. Preferably, the covers 12a are fabricated from electro-tinned steel (Tin Plate), which is relatively inexpensive, and easily formed. Electro-tinned steel has smooth surfaces, which can easily be cleaned The tin plating has a low vapor pressure (5.78 E-21 Pa @232.06° C.) at coating temperatures, and provides relatively good adhesion for most metals and metal oxides, whereby stray coating material will stick to the covers 12a rather than deflect onto the substrate 16. For coating applications above the melting point of tin (232° C.), other sheet metals, such as aluminum and stainless steel, can be used. Surface treatments may be necessary to improve the adhesive characteristics of the outside of the cover 12a.

Reusable covers 12b are preferably made from aluminum or stainless steel. Aluminum can easily be machined and is of light weight, and stray coating material adheres well thereto. Roughening of the outside surface of the aluminum covers 12b can increases material adhesion. Care must be taken to maintain the shape and cleanliness of the substrate supporting lip 18 since aluminum is not very hard. Stainless steel is very hard and provides excellent support for the substrate 16. The outside surface can be roughened or otherwise treaded to enhance adhesion of stray coating material.

Figure 5:
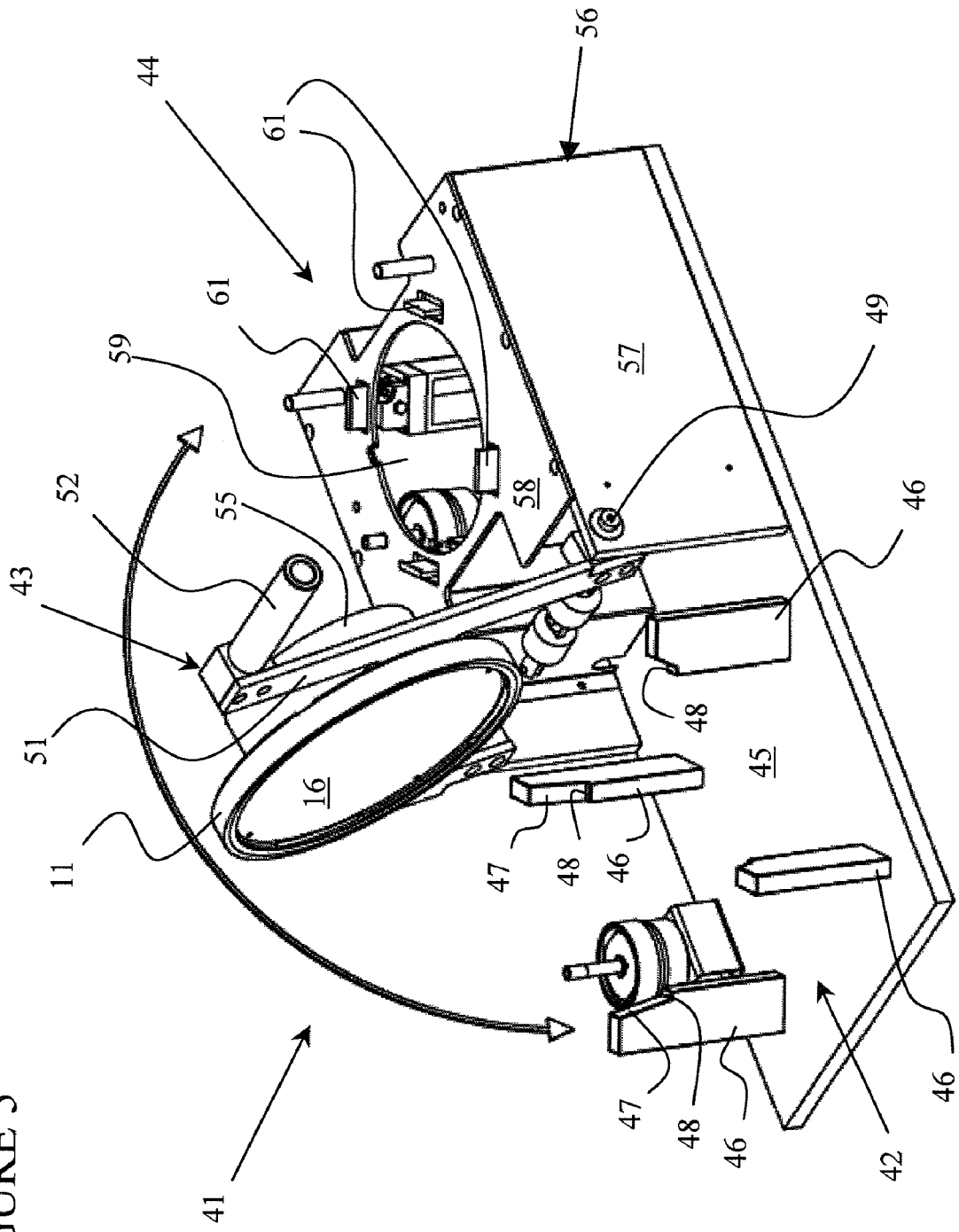
FIG. 5 is an isometric view of the substrate holder assembly device in accordance with the present invention.
Figure 6:
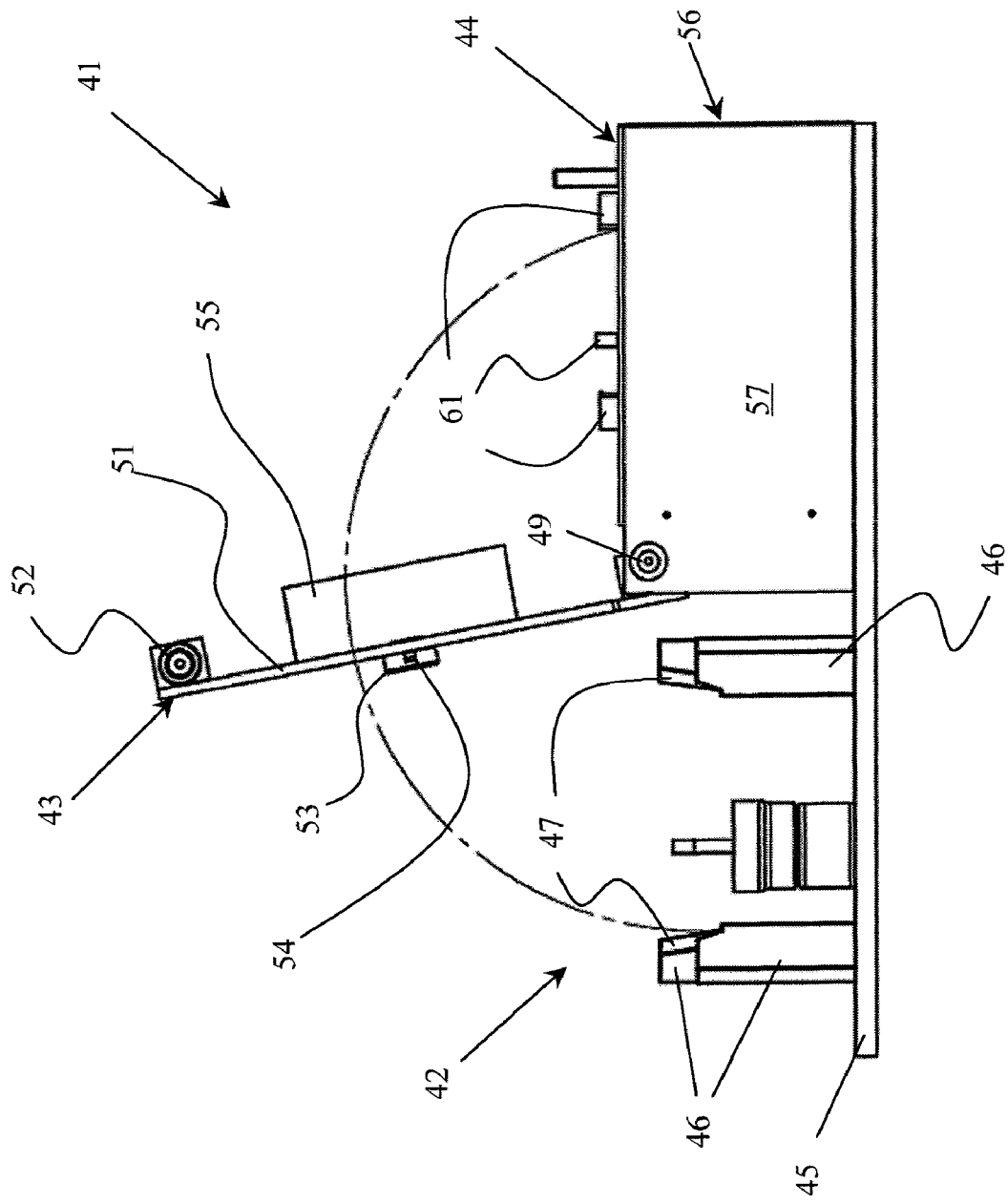
FIG. 6 is a side view of the substrate holder assembly device of FIG. 5.
Figure 7:
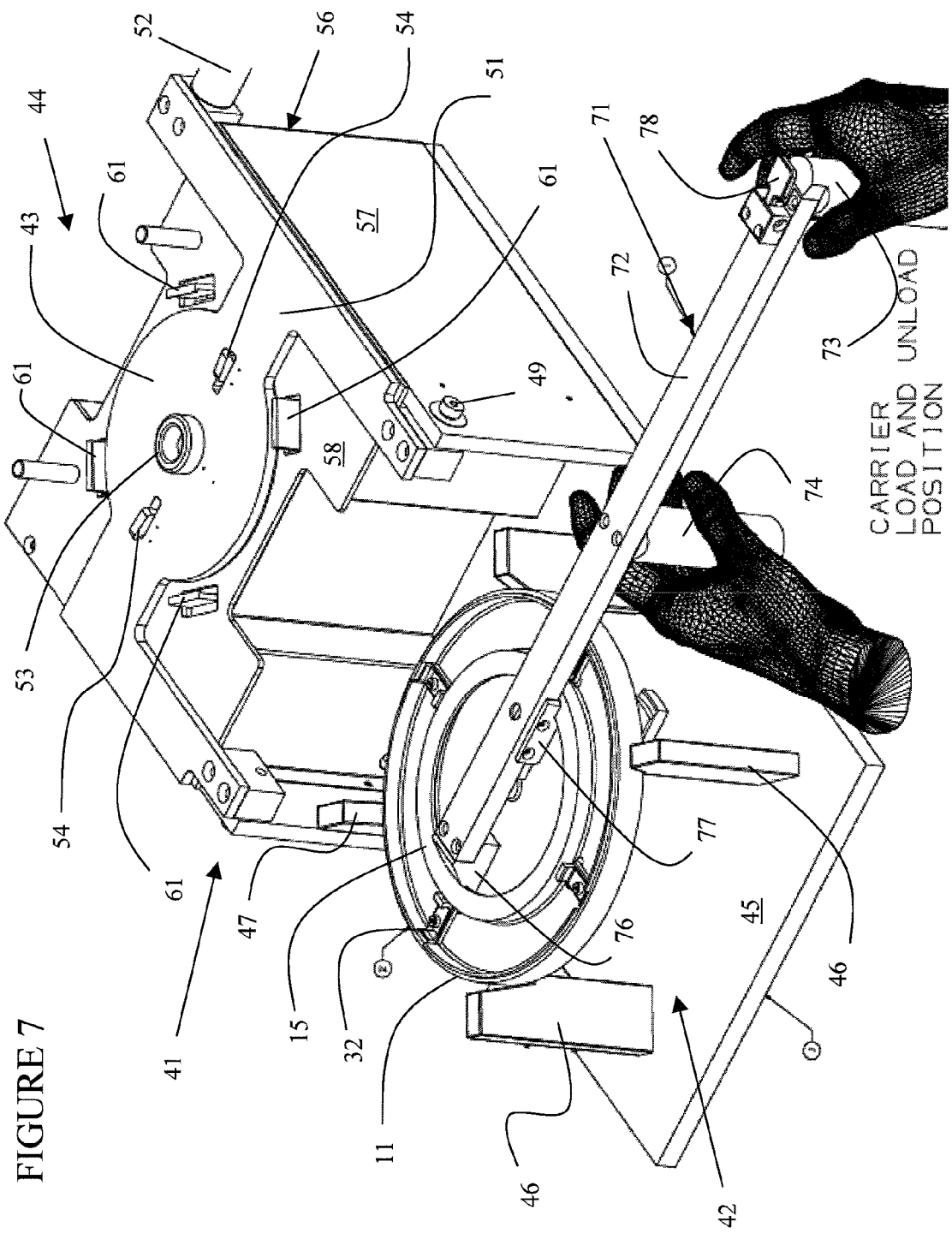
FIG. 7 is an isometric view of the substrate holder assembly device of FIG. 5.

With reference to FIGS. 5, 6 and 7, the substrate holder assembly device, generally indicated at 41, includes a substrate holder mount or rest section 42, a pivot arm 43, and a substrate holder loading dock 44 mounted on a platform 45. The mount section 42 includes four spaced apart pedestals 46, each having a beveled inner corner forming a beveled face 47 and a shoulder 48. The beveled face 47 of each pedestal 46 provides a guiding surface for guiding the substrate holder 11 to a rest position on the four shoulders 48. The illustrated mount section 42 can be replaced by any equivalent structure providing support for the substrate holder 11 during attachment to the pivot arm 42.

The pivot arm 43 is pivotally connected to the loading dock section 44 about a horizontal axis of rotation 49, and comprises a plate 51, extending outwardly from the axis 49, and a handle 52 extending perpendicular to the outer free end of the plate 51. A centering socket 53 with locking fingers 54 extends from the plate 51 proximate the middle thereof for extending into the annular ring 15, whereby the locking fingers 54 can engage the groove 20 and secure the base 13 of the substrate holder 11 to the pivot arm 43. The centering socket 53 receives the cylindrical protrusion 14, when the base 13 is in proper alignment with the pivot arm 43 The actuating mechanism 55 for the locking fingers 54 extends from the plate 51 opposite the centering socket 53.

The loading dock section 44 includes a housing 56 comprised of sidewalls 57 and upper cover 58. The upper cover 58 includes a large circular opening 59 for receiving the actuating mechanism 55 when the pivot arm 43 is pivoted into position on the loading dock section 44. Actuators 61, spaced apart around the opening 59, extend through rectangular openings in the upper cover 58 for engaging the abutment surfaces 37 of the detents 32, whereby movement, e.g. reciprocation or rotation, of the actuators 61, indicated by arrow 62, forces the detents 32 to reciprocate, indicated by arrow 63 in FIG. 4, against the biasing force of the spring 36, thereby disengaging the latching surface 31 from the camming surface of the annular flange 22. In the illustrated embodiment, the four actuators 61 are circumferentially spaced around the opening 59, and each is comprised of a rectangular arm with a rectangular lip 64 extending perpendicularly from the rectangular arm for engaging the abutment surface 37, are illustrated, but any number, arrangement and shape of the actuators 61 is possible depending on the number, position and size of the detents 32 provided on the base 13.

In use, a substrate holder 11 is carefully positioned face down on the mount section 42 and clocked, such that the detents 32 align with the actuators 61. Ideally, the mount section 42 is provided with spaced apart indicators corresponding to the positions of the actuators 61, which the detents 32 are aligned with, whereby when the pivot arm 43 is rotated to the loading dock section 43 the detents 32 are aligned with the actuators 61. In the illustrated embodiment, the detents 32 are aligned with the pedestals 46 in the mount section 42, which ensures the detents 32 will be aligned with the actuators 61 in the loading dock section 43, i.e. the pedestals 46 themselves or the upper surface thereof act as the indicator. The beveled faces 47 of the pedestals 46 guide the substrate holder 11 until the annular flange 22 rests on the shoulders 48. The pivot arm 43 is rotated into position on top of the substrate holder 11 with the centering socket 53 surrounding the cylindrical protrusion 14. To secure the substrate holder 11 to the pivot arm 43, the locking finger or fingers 54 are actuated into position within the groove 20. The pivot arm 43 is then rotated, as illustrated by the arc in FIGS. 5 and 6, until the substrate holder 11 comes to rest face up on the upper cover 58 of the loading dock section 43 with the actuating mechanism 55 extending through the opening 59. In the rest position on the loading dock section 43, the ends of the actuators 61 extend into position proximate their respective abutment surfaces 37. Actuation of the actuators 61 forces the detents 32 out of contact with the camming surface on the annular flange 22, thereby releasing the cover 12a or 12b from the base 13. Accordingly, the cover 12a or 12b and the substrate 16 can be removed from the base 13, and a new substrate 16 and cover 12a or 12 can be replaced thereon. When the actuators 61 are disengaged, the detents 32 become engaged with the camming surface on the new annular flange 22. The latching surface 31 is at an acute angle to the base 13 enabling the latching surface 31 to engage the camming surface of the annular flange 22 at a variety of positions corresponding to different substrate thicknesses. The pivot arm 43 can then be rotated back to the mount section 42, in which the locking fingers 54 are disengaged from the groove 20, thereby releasing the substrate holder 11 from the pivot arm 43. The substrate holder 11 is then relocated to a suitable coating machine for application of a coating on the substrate 16.

The actuators 61, the locking fingers 54, and even the rotation of the pivot arm 43 can be powered, e.g. electrically and/or pneumatically, or simply manually actuated. The power supply can be controlled remotely from a single control box or from separate control locations proximate the specific device actuated, e.g. proximate the mount section 42 and proximate the loading dock section 43.

Figure 8:
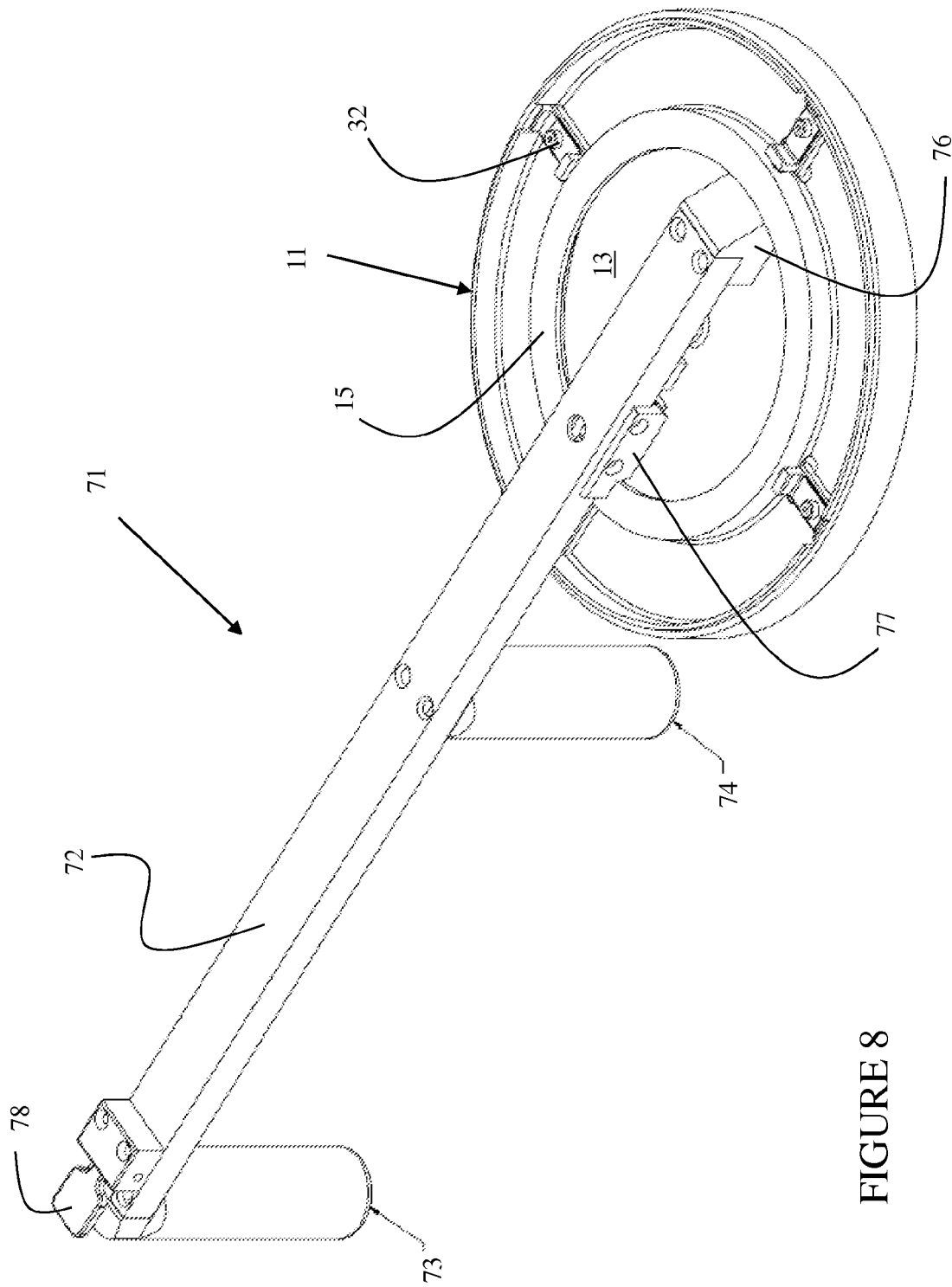
FIG. 8 is an isometric view of a substrate loading/unloading tool in accordance with the present invention.
Figure 9:
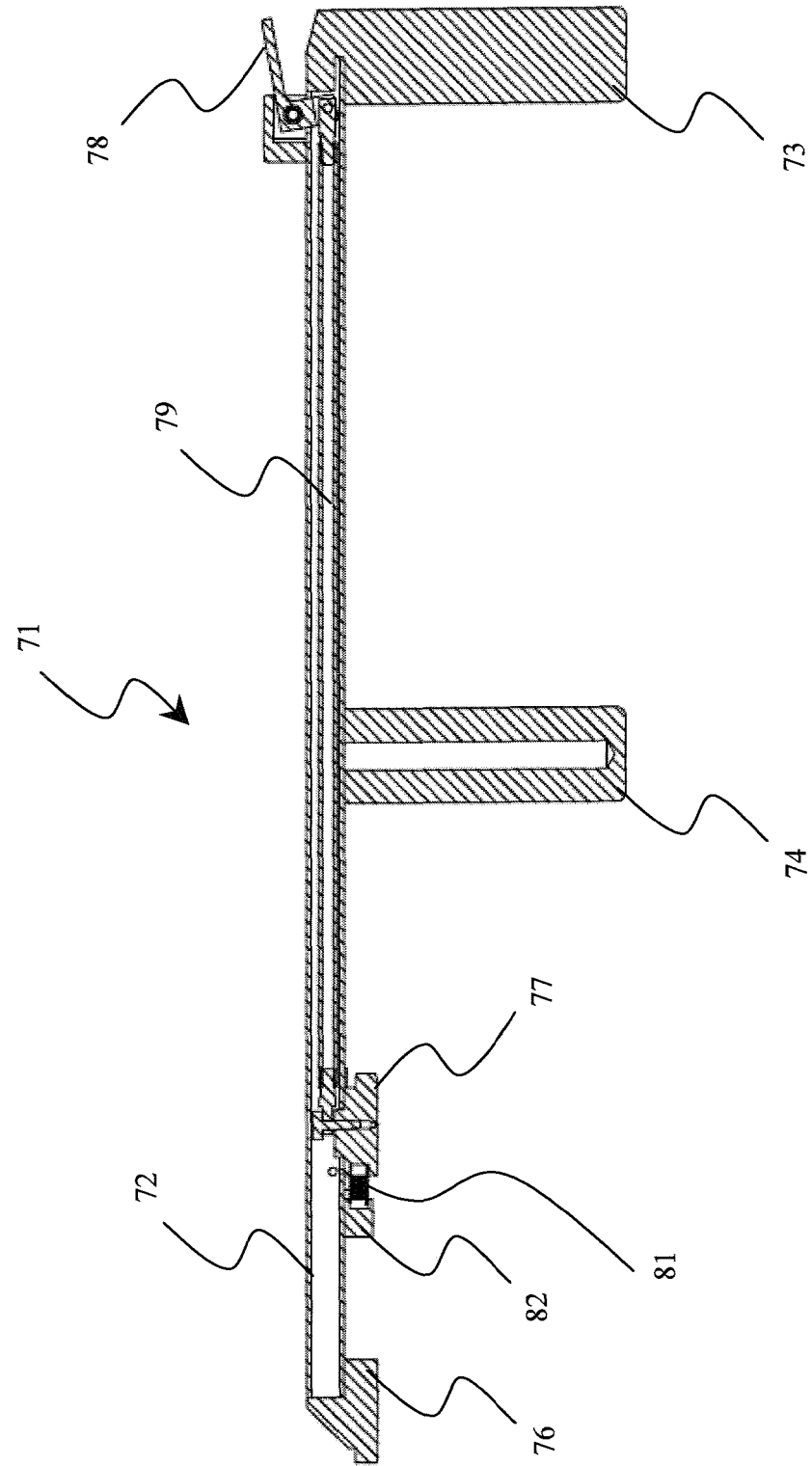
FIG. 9 is a cross-sectional view of the substrate loading/unloading tool of FIG. 8.

With reference to FIGS. 7 to 9, a substrate holder removal tool 71 includes an elongated arm 72 with a first handle 73 fixed at one end thereof, and a second handle 74 fixed proximate a middle thereof. Preferably, both the first and second handles 73 and 74 include a hand grip extending perpendicular to the elongated arm 72. A fixed bracket or wedge 76 extends from an outer free end of the elongated arm 72 for engaging the groove 20 on one side of the annular ring 15. A sliding bracket or wedge 77 is reciprocatable on the elongated arm 72 in an area between the second handle 74 and the fixed wedge 76 for engaging the groove 20 of annular ring 15 at a position diametrically opposed to where the fixed wedge 76 engages the groove 20. An actuating lever 78 is positioned proximate one of the first and second handles 73 and 74 for remotely actuating the sliding wedge 76 to engage or disengage the annular ring 15. The middle of the actuating lever 78 is pivotally mounted to the elongated arm 72, and one end of the actuating lever 78 is pivotally mounted to one end of a reciprocating link or rod 79. The other end of the reciprocating rod 79 abuts the sliding wedge 77, which is spring biased away from the fixed wedge 76 by spring 81. The spring 81 is fixed to a stop shoulder 82 mounted on the elongated arm 72. Accordingly, a force applied to the outer free end of the actuating lever 78 results in rotation thereof and reciprocation of the reciprocating rod 79 within the elongated arm 72 into engagement with the sliding wedge 77, which overcomes the spring force of the spring 81 and forces the sliding wedge 77 towards the fixed wedge 76. As a result, the sliding wedge 77 becomes disengaged from within the groove 20 enabling the tool 71 to be separated from the substrate holder 11.

We claim:

1. A substrate holder assembly device for assembling and disassembling a substrate holder of the type including a base with a detent, and a cover with a catch for engaging the detent and securing the cover to the base, comprising:
   a substrate holder mount for supporting the substrate holder face down;
   a substrate holder loading dock for supporting the substrate holder face up during assembly and disassembly;
   a lifting arm moveable between the substrate holder mount and the substrate holder loading dock for picking the substrate holder up, turning the substrate holder over, and placing the substrate holder on the substrate holder loading dock; and
   actuator means extending from the substrate holder loading dock for disengaging the detent from the catch, thereby enabling the cover to be separated from the base, and a substrate to be loaded or unloaded from the substrate holder.

2. The device according to claim 1, wherein the lifting arm includes a locking finger for engaging a locking groove on the base for securing the substrate holder to the lifting arm.

3. The device according to claim 1, wherein the lifting arm is pivotally mounted between the substrate holder mount and the substrate holder loading dock, whereby rotation of the lifting arm from the substrate holder mount to the substrate holder loading dock flips the substrate holder from face down to face up.

4. The device according to claim 1, wherein the actuator means includes a plurality of moveable actuators spaced apart on the substrate holder loading dock for engaging a plurality of detents mounted on the base.

5. The device according to claim 4, wherein the moveable actuators reciprocate radially inwardly for sliding the detents radially inwardly to release the detents from the catches.

6. The device according to claim 4, wherein the substrate holder mount includes a plurality of indicators corresponding to the relative position of the moveable actuators, whereby alignment of the detents with the indicators in the substrate holder mount ensures that the detents are aligned with the moveable actuators in the substrate holder loading dock.

7. The device according to claim 6, wherein the substrate holder mount includes a plurality of spaced apart pedestals, each pedestal providing one of the plurality of indicators.

8. The device according to claim 7, wherein each pedestal includes a beveled face for guiding the substrate holder to a rest position.

9. The device according to claim 1, further comprising a substrate holder comprising:
   a base including a plurality of detents reciprocatable thereon; and
   a cover including a plurality of catches for engaging the detents.

10. The device according to claim 9, wherein each detent comprises a latching surface for engaging a respective camming surface; and an abutment surface for engaging a respective actuator.

11. The device according to claim 10, wherein the latching surface is at an acute angle to the base, whereby the latching surface is engageable by the camming surface at a plurality of positions depending upon the thickness of the substrate.

12. The device according to claim 10, further comprising spring means for biasing the latching surfaces into engagement with the camming surfaces.

13. The device according to claim 10, wherein the cover includes an annular flange extending around a circumference of the base; and wherein an outer free edge of the flange forms the catches with the camming surfaces.

14. The device according to claim 10, the cover is between 0.005 and 0.015 inches thick, and fabricated from electro-tinned steel, enabling the cover to be disposable after one or two uses.

15. The device according to claim 1, further comprising a removal tool for engaging a locking groove on the base for picking the substrate holder up when mounted on the substrate holder mount.

16. The device according to claim 15, wherein the removal tool includes an elongated handle, a fixed bracket for engaging one side of the locking groove, a sliding bracket for engaging an opposite side of the locking groove, and an actuator mounted on the elongated handle for actuating the sliding bracket into and out of engagement with the locking groove.

* * * * *